United States Patent [19]

Castro et al.

[11] 4,101,976
[45] Jul. 18, 1978

[54] FREQUENCY SELECTIVE OPTICAL DATA STORAGE SYSTEM

[75] Inventors: George Castro; Dietrich Haarer, both of San Jose; Roger Morton MacFarlane, Palo Alto, all of Calif.; Hans Peter Trommsdorff, St. Martin d'Uriage, France

[73] Assignee: International Business Machines Corporation, Armonk, N.Y.

[21] Appl. No.: 768,250

[22] Filed: Feb. 14, 1977

[51] Int. Cl.² .............................................. G11C 13/04
[52] U.S. Cl. ..................................................... 365/119
[58] Field of Search ............. 340/173 CC; 350/160 P, 350/162 SF; 365/119, 121, 216

[56] References Cited

U.S. PATENT DOCUMENTS

| 3,568,167 | 3/1971 | Carson | 340/173 CC |
| 3,654,626 | 4/1972 | Geller et al. | 340/173 CC |
| 3,896,420 | 7/1975 | Szabo | 340/173 CC |
| 4,041,476 | 8/1977 | Swainson | 340/173 CC |

Primary Examiner—Stuart N. Hecker
Assistant Examiner—Donald McElheny
Attorney, Agent, or Firm—Joseph E. Kieninger

[57] ABSTRACT

An optical data storage system and method that utilizes the frequency dimension to increase the storage capacity significantly. The system includes a storage material, for example, in the form of a block, adapted to undergo a photo induced reaction upon exposure to light and which exhibits inhomogeneous absorption line broadening. Data bits are stored by selective photo induced reactions induced by a narrow band laser at specific frequencies within the broad inhomogeneous line. The lifetime of these photo induced data bits is of the order of years so as to provide a non-volatile storage system. In a preferred embodiment, a material is selected so that the photo induced reaction can be made reversible thereby permitting, when desired, the erasing of the data bits.

13 Claims, 5 Drawing Figures

FREQUENCY SELECTIVE OPTICAL DATA STORAGE SYSTEM

FIELD OF THE INVENTION

This invention relates to optical data storage systems, and more particularly to storage systems including the frequency dimension.

BRIEF DESCRIPTION OF PRIOR ART

The patent to Szabo, U.S. Pat. No. 3,896,420 describes an optical data storage system that utilizes the frequency dimension to increase the storage capacity significantly. The Szabo system includes a block of material which can undergo optical saturation and which exhibits inhomogeneous absorption line broadening. Examples of materials that may be used in this system are chromium doped ruby; chromium doped magnesium oxide, $O_2$, $S_2$, $Se_2$ and SeS in KI; etc. Data bits are stored by selective optical saturation caused by a narrow band high intensity laser, i.e. hole burning, at specific frequencies within the broad inhomogeneous line. The optical saturation is a physical phenonemom which only occurs at high light intensities and which involves the excited states of identical atoms which are in a slightly different environment. Szabo's optically saturated data bits remain as long as the block is exposed to the intense broad band laser. As soon as the intense light from the broad band laser is turned off or removed, the lifetime of the data bits in the material is of the order of $10^{-2}$ seconds. Since the data are lost when the power or light is turned off, the system would be classified as a volatile storage system.

SUMMARY OF THE INVENTION

It is a primary object of this invention to provide an improved optical data storage system.

It is still another object of this invention to provide a frequency selective optical memory device.

It is yet still another object of this invention to provide a non-volatile storage system.

It is a further object of this invention to provide a reversible storage system.

It is another object of this invention to provide an improved three-dimensional data storage system.

It is another further object of this invention to provide a fourth dimension to a three-dimensional holographic memory.

It is still another further object of this invention to provide an improved method of storing data.

These and other objects are accomplished by an optical data storage system and method that utilizes the frequency dimension. The system includes a storage material, for example, in the form of a block, adapted to undergo a photo induced reaction upon exposure to light and which exhibits inhomogeneous absorption line broadening. The material undergoes a photochromic reaction or a photochemical reaction. Examples of such materials are the freebase porphyrin ($H_2P$) and tetrazine. Data bits are stored by selective photo induced reactions induced by a narrow band laser at specific frequencies within the broad inhomogeneous line. The lifetime of these photo induced data bits is of the order of years so as to provide a non-volatile storage system. In a preferred embodiment, a material is selected so that the photo induced reaction can be made reversible thereby permitting, when desired, the erasing of the data bits.

Other objects of this invention will be apparent from the following detailed description, reference being made to the accompanying drawing wherein the specific embodiment of the invention is shown.

DESCRIPTION OF THE ILLUSTRATIVE EMBODIMENT

Figure 1:
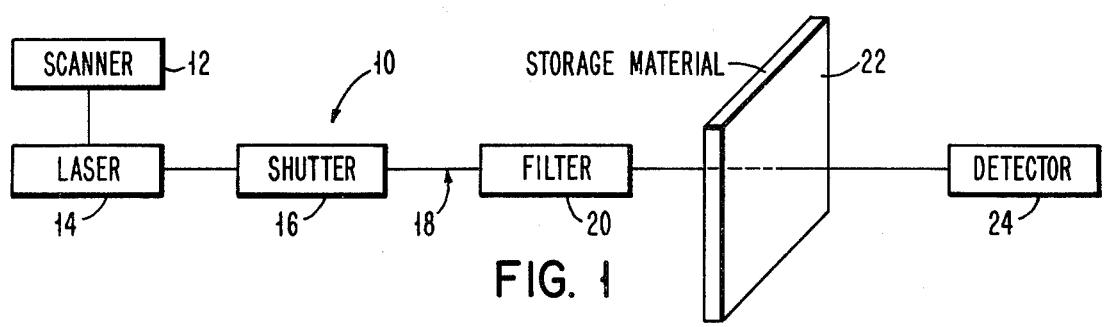
FIG. 1 is a schematic view of the data storage system including means for writing and reading.
Figure 2:
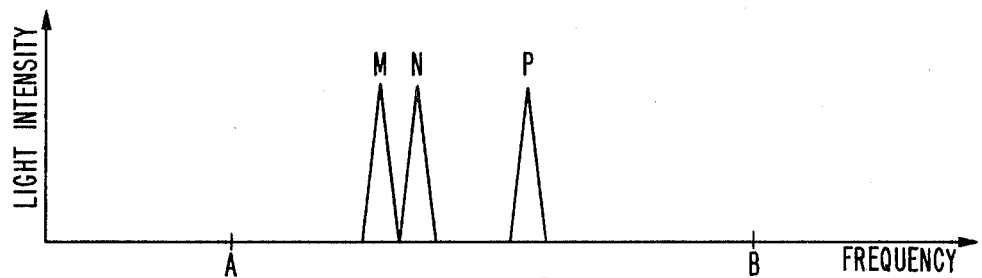
FIG. 2 illustrates an example of a laser output at three specific frequencies.

An optical data storage system suitable for storing data in the frequency dimension to provide a third dimension is shown in FIG. 1. The system 10 includes a laser 12 having a scanner 14 associated thereto which permits the frequency of the laser to be varied as is standard in the art. The light from the laser 12 is passed through a shutter 16 which enables light at selected frequencies to pass therethrough. A specific example of the laser frequencies coming out of the shutter 16 which are at point 18 are illustrated in FIG. 2 where frequencies M, N, and P are shown. The filter 20 and the detector 24 are not used during the write cycle and will be hereinafter fully described during the description covering the read function of the system.

The laser 12 has to be frequency stabilized, tunable over the frequency range of the inhomogeneous line width, and operate in a narrow band mode. The laser can be focused down to a dimension of the order of 1 micron. Dimensions of this size yield spot densities of $10^8/cm^2$. The spatial deflection of the laser (not shown) is accomplished with optical means well known in the art.

Figure 3:
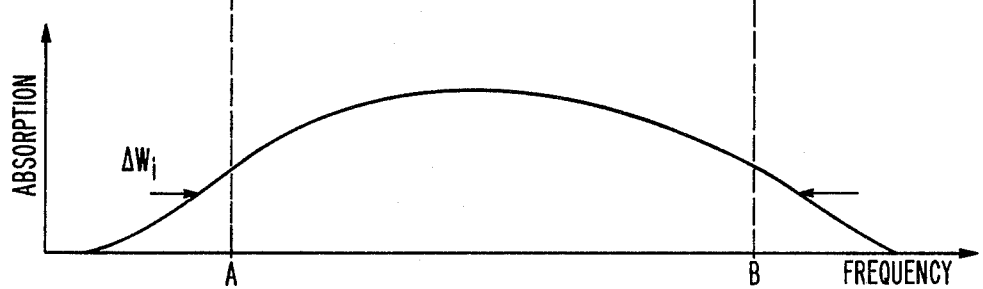
FIG. 3 illustrates the inhomogeneous absorption of the material before exposure to the laser frequencies illustrated in FIG. 2.

The storage material 22 is a layer or block of material which is adapted to undergo a photo-induced reaction upon exposure to light. The photo-induced reaction would be a photo-chemical reaction or a photochromic reaction, i.e., a light induced change in the materials optical properties. The material involves a reaction of the atoms, molecules or molecular aggregates which may be reversible or permanent. The material must also exhibit an inhomogeneous absorption line broadening in an inhomogeneous matrix such as shown in FIG. 3. In FIG. 3, a material has an inhomogeneous absorption line which extends over a frequency range of A to B. An example of a material which undergoes a reversible photochromic reaction is the free base porphyrin, $H_2P$ in a certain matrix. An example of a material which undergoes an irreversible photochemical reaction is tetrazine. Other examples of materials are the deuterated porphyrin analog, $D_2P$, phtalocyanine and tetraphenyl porphyrin. Other materials which exhibit inhomogeneous absorption line broadening in an inhomogeneous matrix and undergo a photo induced reaction upon exposure to light may be used in the practice of this invention.

Figure 4:
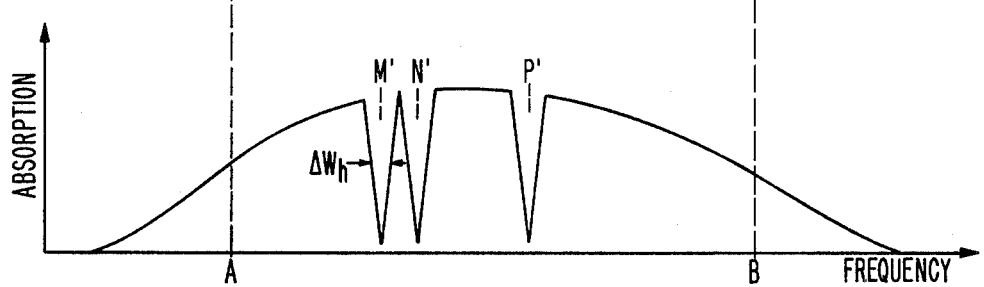
FIG. 4 illustrates the absorption of the material after exposure to the laser frequencies set forth in FIG. 2.

In accordance with this invention, when the laser light having a frequency M, (shown in FIG. 2), for example, ultraviolet, visible or infrared radiation, enters the storage material film or block 22 having an inhomogeneous absorption with the band width AB (shown in FIG. 3), the laser burns a hole M' as shown in FIG. 4 which corresponds to a data bit. This phenomena is known as optical photoreactive hole burning and its mechanism is completely different from the prior art (Szabo) optical saturation which depends on high intensities. In optical photoreactive hole burning, certain molecules undergo structural or chemical changes to yield non-volatile products which have different optical properties than the starting molecules. This phenomenon occurs at both low and high intensities; it utilizes the ground state of molecules as opposed to the optical saturation phenomenon which utilizes excited states. The light intensity only affects the writing speed. The photochemistry of this type of hole burning involves only those molecules which absorb at a certain frequency, in this case, M. The other molecules in the material which absorb at frequencies other than M are unchanged since they don't participate in the photoinduced reaction.

After the hole at M frequency has been burned or created, the laser 12 and the shutter 16 are adjusted so that laser light having frequency N (shown in FIG. 2) enters the material 22 to burn a hole N' as shown in FIG. 4. Other molecules in the material which absorb at frequencies other than N are unchanged since they don't participate in the photoinduced reaction.

Similarly, when the laser light has a frequency P, only those molecules which absorb at P react to burn a hole P' as shown in FIG. 4.

Once holes or data bits M, N and P have been created, the holes represent a non-volatile product, i.e., the holes remain unchanged when the light from the laser has been turned off. The lifetime of the data bits corresponds to the lifetime of the photoreaction product which is on the order of years.

The storage feature of this invention lies in the tuning of the frequency of the laser to burn a number of holes into the inhomogeneous broadened line AB. The number of bits in the frequency dimension, that is, the number of holes, is determined by $N = \frac{1}{2}\Delta W_I/\Delta W_H$, the ratio of the inhomogeneous band width to the width of the hole. $\Delta W_H$ is known in the literature to be as narrow as 10 $MH_Z$ for some systems at low temperatures and $\Delta W_I$ is known to be as broad as $10^3 GH_Z$ for other systems. A system containing these two extremes would be able to provide as many as $10^4$ to $10^5$ bits in such an absorption band. Since $\Delta W_H$ is in most instances much smaller at low temperatures and since $\Delta W_I$ is substantially temperature independent, the storage capacity of the memory is higher at low operating temperatures.

Figure 5:
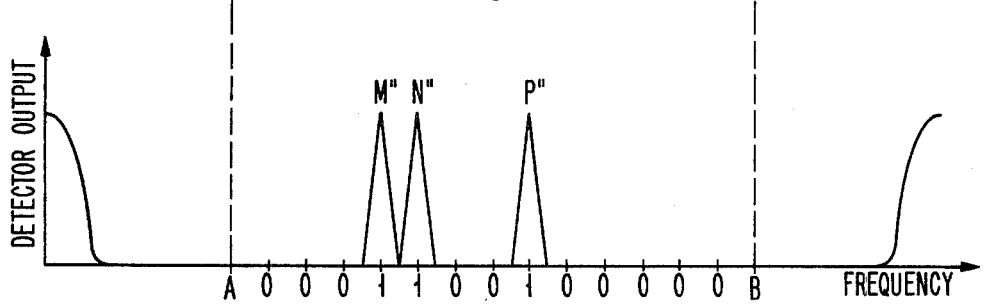
FIG. 5 illustrates the detector output obtained by scanning the laser over the frequency range AB.

Reading the data may be achieved in a number of ways. One approach is shown in FIG. 1 in which the same laser optics that are used for writing are also used for reading. However, the intensity of the light from the laser 12 is passed through a filter 20 which reduces the intensity of the light to prevent further hole burning as was done in the writing process. A laser's light scans over a frequency range which is greater than A through B through the filter 20 and the storage material 22 into a detector 24. Data such as that shown in FIG. 5 is obtained from the detector 24. The detector output shows peaks at M", N" and P" frequencies where holes had been previously burned. Peaks M", N" and P" in the detector output correspond to storage bits of information "1" and zero detector outputs are bits of information "0".

The reading and the writing of the data bits may be accomplished with the storage material of this invention by using a different optical element arrangement than the one shown in FIG. 1 as would be known to one skilled in the art. For example, an intensity modulator (not shown) may be used to replace the shutter 16 and the filter 12, thereby performing both the switching of light function and the dimming (light attenuation) of light function.

There are alternative ways to read the information by using several excited states of one molecule. For instance, a particular material would have both a singlet and triplet excited state. Assuming that only one of the states is photoreactive, say the singlet, then the information would be written in the singlet mode and could be non-destructively read in the triplet mode. Another way would be to use two lasers of different wavelengths in the writing mode and one laser in the reading mode.

Another approach to reading the information would be based on utilizing the reflectivity or fluorescence characteristics of the material instead of the absorption characteristics.

The preceding portion of the specification had described the use of the frequency dimension with a spatially twodimensional storage system with a layer of material to yield a three-dimensional optical storage system. The preceding portion is also applicable to a three-dimensional holographic storage system as is known in the art with a block of material to yield a four-dimensional storage system.

Although a preferred embodiment of this invention has been described, it is understood that numerous variations may be made in accordance with the principles of this invention.

What is claimed is:

1. A frequency selective optical data storage system comprising:
   a material, said material exhibiting inhomogeneous absorption line broadening and capable of storing at least two data bits in the frequency dimension, said material adapted to undergo a photo-induced reaction resulting in information stored in the non-volatile ground state of the material upon exposure to a light source having a wavelength bandwidth narrower than the inhomogeneous line width, and
   a first laser adapted to write non-volatile information on said material with a wavelength narrower than and within the broad inhomogeneous absorption line.

2. A system as described in claim 1 wherein said material undergoes a reversible photoinduced reaction.

3. A system as described in claim 1 wherein said material undergoes an irreversible photoinduced reaction.

4. A system as described in claim 1 wherein said material undergoes a photochemical reaction.

5. A system as described in claim 1 wherein said material undergoes a photochromic reaction.

6. A system as described in claim 1 wherein said first laser is adapted to read said information.

7. A system as described in claim 1 wherein said laser is adapted to scan said material.

8. A system as described in claim 1 including a second laser adapted to read said information.

9. A three-dimensional optical data storage system comprising:
   a layer of material having an inhomogeneous absorption line broadening and capable of storing at least two data bits in the frequency dimension, said material adapted to undergo a photo-induced reaction upon exposure to a light source having a wavelength bandwidth narrower than the inhomogeneous line width whereby said material is converted to a new structural configuration in the ground state, and a first laser adapted to form a hole in a narrow band mode with a wavelength narrower than and in said inhomogeneous absorption line wherein non-volatile information is formed in the frequency dimension of said system.

10. A four-dimensional holographic memory system comprising:

a block of material having an inhomogeneous absorption line broadening and capable of storing at least two data bits in the frequency dimension, said material adapted to undergo a photo-induced reaction upon exposure to a light source having a wavelength bandwidth narrower than the inhomogeneous line width whereby said material is converted to a new structural configuration in the non-volatile ground state, and a first laser adapted to form a hole in a narrow band mode with a wavelength narrower than and in said inhomogeneous absorption line of said block wherein non-volatile information is formed in the frequency dimension of said system.

11. A method of storing data in an optical storage system comprising the steps of:

providing a material exhibiting inhomogeneous absorption line broadening and capable of storing at least two data bits in the frequency dimension, said material adapted to undergo a photo-induced reaction resulting in information stored in the non-volatile ground state of the material upon exposure to a light source having a wavelength bandwidth narrower than the inhomogeneous line width, and exposing said material to light at a specific frequency with a wavelength narrower than and within the inhomogeneous line width whereby a reaction occurs in said material to form a hole in the frequency dimension which represents a data bit, said material adapted so that said hole remains upon the removal of said light.

12. A method as described in claim 11 whereby a laser is used to expose said material to light.

13. A method as described in claim 12 whereby said laser scans the broad inhomogeneous line to expose said material to light at a plurality of specific frequencies to form a plurality of data bits.

* * * * *